United States Patent

Berger

(10) Patent No.: US 9,941,117 B2
(45) Date of Patent: Apr. 10, 2018

(54) TUNNELING FIELD EFFECT TRANSISTORS AND TRANSISTOR CIRCUITRY EMPLOYING SAME

(71) Applicant: The Ohio State University, Columbus, OH (US)

(72) Inventor: Paul R. Berger, Columbus, OH (US)

(73) Assignee: OHIO STATE INNOVATION FOUNDATION, Columbus, OH (US)

( * ) Notice: Subject to any disclaimer, the term of this patent is extended or adjusted under 35 U.S.C. 154(b) by 121 days.

(21) Appl. No.: 14/947,260

(22) Filed: Nov. 20, 2015

(65) Prior Publication Data

US 2016/0086800 A1 Mar. 24, 2016

Related U.S. Application Data

(62) Division of application No. 13/496,542, filed as application No. PCT/US2010/048610 on Sep. 13, 2010, now Pat. No. 9,209,285.

(Continued)

(51) Int. Cl.
*H01L 21/02* (2006.01)
*H01L 29/739* (2006.01)

(52) U.S. Cl.
CPC .... *H01L 21/02532* (2013.01); *H01L 21/0245* (2013.01); *H01L 21/02381* (2013.01);
(Continued)

(58) Field of Classification Search
CPC ........... H01L 29/7391; H01L 21/02387; H01L 21/02532; H01L 21/02631;
(Continued)

(56) References Cited

U.S. PATENT DOCUMENTS 6,724,024 B1 4/2004 Tsu-Jae
2003/0124761 A1* 7/2003 Baert ................ B81C 1/00666
438/50

(Continued)

OTHER PUBLICATIONS

Bhuwalka, et al. "Scaling the Vertical Tunnel FET with Tunnel Bandgap Modulation and Gate Workfunction engineering", May 2005, IEEE Transaction on Electron Devices, vol. 52, No. 5, pp. 909-917.

(Continued)

*Primary Examiner* — Hrayr A Sayadian
(74) *Attorney, Agent, or Firm* — Fay Sharpe LLP

(57) ABSTRACT

A p-channel tunneling field effect transistor (TFET) is selected from a group consisting of (i) a multi-layer structure of group IV layers and (ii) a multi-layer structure of group III-V layers. The p-channel TFET includes a channel region comprising one of a silicon-germanium alloy with non-zero germanium content and a ternary III-V alloy. An n-channel TFET is selected from a group consisting of (i) a multi-layer structure of group IV layers and (ii) a multi-layer structure of group III-V layers. The n-channel TFET includes an n-type region, a p-type region with a p-type delta doping, and a channel region disposed between and spacing apart the n-type region and the p-type region. The p-channel TFET and the n-channel TFET may be electrically connected to define a complementary field-effect transistor element. TFETs may be fabricated from a silicon-germanium TFET layer structure grown by low temperature molecular beam epitaxy at a growth temperature at or below 500° C.

12 Claims, 15 Drawing Sheets

Related U.S. Application Data

(60) Provisional application No. 61/243,368, filed on Sep. 17, 2009.

(52) U.S. Cl.
CPC .. *H01L 21/02387* (2013.01); *H01L 21/02505* (2013.01); *H01L 21/02576* (2013.01); *H01L 21/02579* (2013.01); *H01L 21/02584* (2013.01); *H01L 21/02631* (2013.01); *H01L 21/02664* (2013.01); *H01L 29/7391* (2013.01)

(58) Field of Classification Search
CPC ......... H01L 21/02664; H01L 21/02584; H01L 21/0245; H01L 21/02505; H01L 21/02576; H01L 21/02579; H01L 21/02381
USPC ........................................................ 438/509
See application file for complete search history.

(56) References Cited

U.S. PATENT DOCUMENTS

| | | |
|---|---|---|
| 2005/0269628 A1 | 12/2005 | King |
| 2008/0050881 A1 | 2/2008 | Chen et al. |
| 2008/0296622 A1 | 12/2008 | Kiewra et al. |
| 2008/0315206 A1* | 12/2008 | Herner ................. H01L 27/115 257/66 |
| 2009/0017603 A1* | 1/2009 | Yang ................... H01L 21/0206 438/503 |
| 2009/0064922 A1 | 3/2009 | Boone et al. |
| 2009/0184346 A1 | 7/2009 | Jain |

OTHER PUBLICATIONS

Bhuwalka, et al. "Vertical Tunnel Field-Effect transistor", Feb. 2004, IEEE Transactions on Electron Devices, vol. 51, No. 2, pp. 279-282.

Sedlmaier, S., et al. "Gate-controlled resonant interbred tunneling in silicon", Sep. 6, 2004, Applied Physics Letters, vol. 85, No. 10, pp. 1707-1709.

International Search Report dated Jan. 31, 2011 for International application No. PCT/US2010/48610.

Written Opinion dated Jan. 31, 2011 for International application No. PCT/US2010/48610.

International Preliminary Report on Patentability dated Mar. 20, 2012.

* cited by examiner n-channel Tunneling Field-Effect Transistor
(n-channel TFET)

Structure Sheet Resistance = 6.886e+00 Ohms/square

Layer sheet concentrations

/ 10

| | surface | ohmic | | | |
|---|---|---|---|---|---|
| 22 → | 500.0 Ang | Si | | ns= 9.659e-07 cm-2, | ps= 2.476e+14 cm-2 |
| 20 → | 10.0 Ang | SiGe | | ns= 1.350e-07 cm-2, | ps= 2.858e+13 cm-2 |
| 24 → | 10.0 Ang | SiGe | p-type δ | ns= 6.025e-10 cm-2, | ps= 4.831e+13 cm-2 |
| 18 → | 40.0 Ang | SiGe | | ns= 1.152e-02 cm-2, | ps= 2.859e+13 cm-2 |
| 16 → | 300.0 Ang | Si | Channel | ns= 1.212e+12 cm-2, | ps= 1.905e+10 cm-2 |
| 14 → | 1000.0 Ang | Si | | ns= 4.972e+14 cm-2, | ps= 4.888e-06 cm-2 |
| 12 → | substrate | ohmic | | | |

Temperature = 300.0 K

Schrodinger solution from 3.000e+01 Ang to 1.200e+03 Ang.

The following subband energies were found (E-Ef):

Heavy hole eigenvalue 1 = 3.166559e-01 eV
Heavy hole eigenvalue 2 = 1.142161e-01 eV
Light hole eigenvalue 1 = 2.472048e-01 eV

Fig. 1 p-channel Tunneling Field-Effect Transistor (p-channel TFET)

Structure Sheet Resistance = 8.367e+00 Ohms/square

Layer sheet concentrations

| | surface | ohmic | | | |
|---|---|---|---|---|---|
| 62 → | 500.0 Ang | Si | | ns= 2.712e+14 cm-2, | ps= 2.372e-06 cm-2 |
| 60 → | 10.0 Ang | Si | n-type δ | ns= 5.147e+13 cm-2, | ps= 2.060e-11 cm-2 |
| 58 → | 10.0 Ang | Si | | ns= 2.190e+13 cm-2, | ps= 3.407e-06 cm-2 |
| 56 → | 300.0 Ang | SiGe | Channel | ns= 3.057e+12 cm-2, | ps= 1.887e+12 cm-2 |
| 54 → | 1000.0 Ang | Si | | ns= 1.818e-06 cm-2, | ps= 4.972e+14 cm-2 |
| 52 → | substrate | ohmic | | | |

Temperature = 300.0 K

Schrodinger solution from 5.000e+01 Ang to 1.200e+03 Ang.

The following subband energies were found (E-Ef):

Electron eigenvalue 1 = -1.248139e-01 eV

Fig. 5

| surface | ohmic | | | |
|---|---|---|---|---|
| 50.0 Ang | Si | | ns= 2.518e+10 cm-2, | ps= 2.075e+13 cm-2 |
| 20.0 Ang | Si | | ns= 1.020e+12 cm-2, | ps= 1.541e-05 cm-2 |
| 300.0 Ang | Ge | 100% Ge | ns= 1.133e+12 cm-2, | ps= 1.359e+09 cm-2 |
| 50.0 Ang | SiGe | | ns= 1.279e+04 cm-2, | ps= 2.005e+10 cm-2 |
| 50.0 Ang | SiGe | | ns= 3.632e+02 cm-2, | ps= 1.851e+11 cm-2 |
| 50.0 Ang | SiGe | | ns= 1.598e+01 cm-2, | ps= 7.941e+11 cm-2 |
| 50.0 Ang | SiGe | | ns= 7.428e-01 cm-2, | ps= 2.153e+12 cm-2 |
| 50.0 Ang | SiGe | | ns= 5.840e-02 cm-2, | ps= 3.094e+12 cm-2 |
| 50.0 Ang | SiGe | | ns= 3.064e-03 cm-2, | ps= 4.881e+12 cm-2 |
| 50.0 Ang | SiGe | | ns= 1.487e-04 cm-2, | ps= 7.751e+12 cm-2 |
| 50.0 Ang | SiGe | | ns= 9.273e-07 cm-2, | ps= 1.933e+13 cm-2 |
| 50.0 Ang | Si | 0% Ge | ns= 8.262e-07 cm-2, | ps= 8.241e+12 cm-2 |
| 100.0 Ang | Si | | ns= 1.986e-07 cm-2, | ps= 4.787e+13 cm-2 |
| substrate | ohmic | | | |

TUNNELING FIELD EFFECT TRANSISTORS AND TRANSISTOR CIRCUITRY EMPLOYING SAME

This application is a divisional of U.S. Ser. No. 13/496,542 filed Apr. 20, 2012 since issued as U.S. Pat. No. 9,209,285 on Dec. 8, 2015 which is a national stage entry of PCT/US10/48610 filed Sep. 13, 2010 which claims the benefit of U.S. Provisional Application No. 61/243,368 filed Sep. 17, 2009 naming inventor Paul R. Berger and titled "Silicon-based Tunneling Field Effect Transistors and Transistor Circuitry Employing Same".

This application incorporates by reference in its entirety U.S. Provisional Application No. 61/243,368 filed Sep. 17, 2009 naming inventor Paul R. Berger and titled "Silicon-based Tunneling Field Effect Transistors and Transistor Circuitry Employing Same".

BACKGROUND

The following relates to the electronic arts, electronic devices arts, electronic circuitry arts, and related arts.

Silicon based field effect transistor (FET) devices are building blocks of silicon-based digital, analog, and hybrid electronics. In a known approach, a metal-oxide-silicon (MOS) structure is used, where in practice the "oxide" may be replaced by various dielectric materials of suitable characteristics. p-type MOS devices and n-type MOS devices are interconnected to generate so-called "complementary" MOSFET circuits, known as CMOS transistor circuitry, that has substantial advantages in terms of low power and high speed operation. In an ever-increasing quest for high device speeds, a principle design optimization tool has been reduction of the channel length, which for CMOS devices is now well into the submicron range for commercial devices. A side benefit is miniaturization of the CMOS circuitry leading to ever more compact electronics.

However, CMOS technology is believed to be approaching certain fundamental limits with respect to channel length, power consumption, steep subthreshold slopes, and related aspects such as leakage current and defect effects that may impose limits on the speed of CMOS circuitry. These limitations are considered to be consequences of the rather complex material formulation of CMOS which combines electronic conductor, dielectric, and semiconductor materials, with the primary electrical current flowing laterally along and proximate to the dielectric/semiconductor interface.

Substantial effort has therefore been directed toward developing improved performance device topologies that can be scalable to still smaller dimensions with consequent speed enhancement. Diffusion-based current transport is limited by thermal broadening and sets a limit upon CMOS transistor subthreshold slopes of 60 mV per decade of current, which in turn restricts their low-voltage operation. As chip power consumption has become a premium challenge, a shift towards lower drive voltages mitigates some power losses, but now a physical barrier exists for conventional CMOS.

One approach to break this physical barrier is the tunneling field effect transistor (TFET). For example, one TFET configuration is the $p^+$in diode design, in which a degenerately p-type silicon layer is spaced apart from an n-type silicon layer by a low-doped silicon separator layer (the "i" silicon layer, which may in general be either p-type or n-type but is generally doped at a lower magnitude than the p+ and n end regions). Unlike MOS devices that to date employ lateral current conduction, many TFET designs envisioned are vertical devices, although some lateral TFETs are sought to retain lateral topologies for historical consistency. Some such vertical devices are described, for example, in Bhuwalka et al., "Vertical Tunnel Field-Effect Transistor", IEEE Transactions on Electron Devices vol. 51 no. 2 pp. 279-82 (2004) and Sedlmaier et al., "Gate-controlled resonant interband tunneling in silicon", Applied Physics Letters vol. 85 no. 10, pp. 1707-09 (2004).

The $p^+$in TFET device design operates on the basis of band-to-band tunneling current injection into the channel, bypassing limits placed by diffusion injection. Advantageously, it is reported that the device can operate substantially symmetrically in either an "n-channel" mode or a "p-channel" mode. In the n-channel mode a positive gate bias induces a tunnel junction proximate to the $p^+$ silicon layer; whereas, in the p-channel mode a negative gate bias induces a tunnel junction proximate to the n-type "drain" end of the diode. Yet another advantage is that the use of heavy doping in the $p^+$in diode design might be expected to lead to suppressed impact of defects on the TFET device performance.

However, in the unbiased state there is little or no excess charge available proximate to the junction. As a consequence, turn-on voltage is undesirably high. The "on" current density is also lower than desired for device applications. Further, the p-channel operating mode does not exhibit drain current ($I_D$) saturation, which limits applicability in digital circuitry and leads to asymmetry between the performance of the p-channel and n-channel TFET devices, respectively. The lack of truly symmetric n-channel and p-channel devices also constrains the ability to mimic the complementary transistor circuitry of CMOS technology in this TFET system.

To reduce turn-on voltage, it has been proposed to replace the $p^+$ silicon layer with a thin, degenerately doped p-type silicon germanium (SiGe) layer. Such devices are proposed and mathematically modeled in Bhuwalka et al., "Scaling the Vertical Tunnel FET With Tunnel Bandgap Modulation and Gate Workfunction Engineering", IEEE Transactions on Electron Devices vol. 52 no. 5, pp. 909-17 (2005). In this variant $p^+$in diode TFET, the lower bandgap of the thin $p^+$ SiGe layer provides a quantum confinement for storing excess charge proximate to the source (p-end) of the pin diode junction, which is predicted to improve "on"-current and threshold voltage characteristics.

However, these $p^+$-SiGe/i-silicon/n-silicon diode TFETs also have problems. Reported results so far have shown smaller "on" currents than will be required for circuit drive compatibility and smaller "off" currents than desired. The mathematical simulations predict increased "off" currents with increasing Ge content. The ratio of "on" current to "off" current is an important parameter impacting device applicability in diverse areas. For example, reliable low-power digital electronics rely upon a small ratio to enable the use of low "on" voltages. Additionally, the inclusion of Ge at the p-source end is predicted to affect the n-channel device performance more greatly, thus increasing the already-significant performance asymmetry between the n-channel and p-channel modes observed for the homogeneous $p^+$in silicon diode TFET devices.

Accordingly, improved TFET designs would be advantageous for use in FET applications generally, and for use in complementary (that is, "CMOS-like") elements particularly.

BRIEF DESCRIPTION

In some illustrative embodiments disclosed as illustrative examples herein, an electronic device or circuit comprises:

a p-channel tunneling field effect transistor (p-channel TFET) selected from a group consisting of (i) a multi-layer structure of group IV layers and (ii) a multi-layer structure of group III-V layers; wherein the p-channel TFET includes a channel region comprising one of a silicon-germanium alloy with non-zero germanium content and a ternary III-V alloy.

In some illustrative embodiments as set forth in the immediately preceding paragraph, the p-channel TFET comprises a multi-layer structure of group layers and includes a channel region comprising a ternary III-V alloy. In some illustrative embodiments as set forth in the immediately preceding paragraph, the p-channel TFET comprises a multi-layer structure of indium-gallium-arsenide III-V layers and includes a channel region comprising a ternary InGaAs alloy. In some illustrative embodiments as set forth in the immediately preceding paragraph, the p-channel TFET comprises a multi-layer structure of group IV layers and includes a channel region comprising a silicon-germanium alloy with non-zero germanium content. In some illustrative embodiments as set forth in the immediately preceding paragraph, the electronic device or circuit further comprises an n-channel tunneling field-effect transistor (n-channel TFET) selected from a group consisting of (i) a multi-layer structure of group IV layers and (ii) a multi-layer structure of group III-V layers. In some illustrative embodiments as set forth in the immediately preceding paragraph, the electronic device or circuit further comprises an n-channel tunneling field-effect transistor (n-channel TFET) selected from a group consisting of (i) a multi-layer structure of group IV layers and (ii) a multi-layer structure of group III-V layers, and the p-channel TFET and the n-channel TFET are electrically connected to define a complementary field-effect transistor element.

In some illustrative embodiments disclosed as illustrative examples herein, a method for fabricating a tunneling field effect transistor (TFET) comprises: growing a silicon-germanium TFET layer structure by LT-MBE at a growth temperature at or below 500° C.; and processing the silicon-germanium TFET layer structure to form a TFET device.

In some illustrative embodiments disclosed as illustrative examples herein, an electronic device or circuit comprises: a tunneling field effect transistor (TFET) selected from a group consisting of (i) a multi-layer structure of group IV layers and (ii) a multi-layer structure of group III-V layers; wherein the TFET includes a channel region and an adjacent region comprising a group IV or group III-V alloy containing a delta doping of dopant atoms which are diffusers in the group IV or group III-V alloy. In some such embodiments, the TFET comprises an n-channel tunneling field-effect transistor (n-channel TFET) with a group IV channel and an adjacent region comprising a silicon-germanium alloy with non-zero germanium content that contains a p-type delta doping of dopant atoms which are interstitial diffusers in the silicon-germanium alloy, the p-type delta doping having a hole concentration of at least about $5 \times 10^{19}$ cm$^{-3}$.

In some illustrative embodiments disclosed as illustrative examples herein, an electronic device or circuit comprises: an n-channel tunneling field effect transistor (n-channel TFET) selected from a group consisting of (i) a multi-layer structure of group IV layers and (ii) a multi-layer structure of group III-V layers; wherein the n-channel TFET includes an n-type region, a p-type region with a p-type delta doping or a low bandgap material with a large valence band offset, and a channel region disposed between and spacing apart the n-type region and the p-type region. In some such embodiments the n-channel TFET comprises a multi-layer structure of group IV layers in which the p-type region includes a silicon-germanium alloy containing a p-type delta doping. In some such embodiments the n-channel TFET comprises a multi-layer structure of group III-V layers in which the p-type region includes an indium gallium arsenide alloy containing a p-type delta doping.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention.

FIG. 1 diagrammatically illustrates a layer structure for an n-channel tunneling field-effect transistor (n-channel TFET).

FIG. 5 diagrammatically illustrates a layer structure for an p-channel tunneling field-effect transistor (p-channel TFET).

DETAILED DESCRIPTION OF PREFERRED EMBODIMENTS

Figure 2:
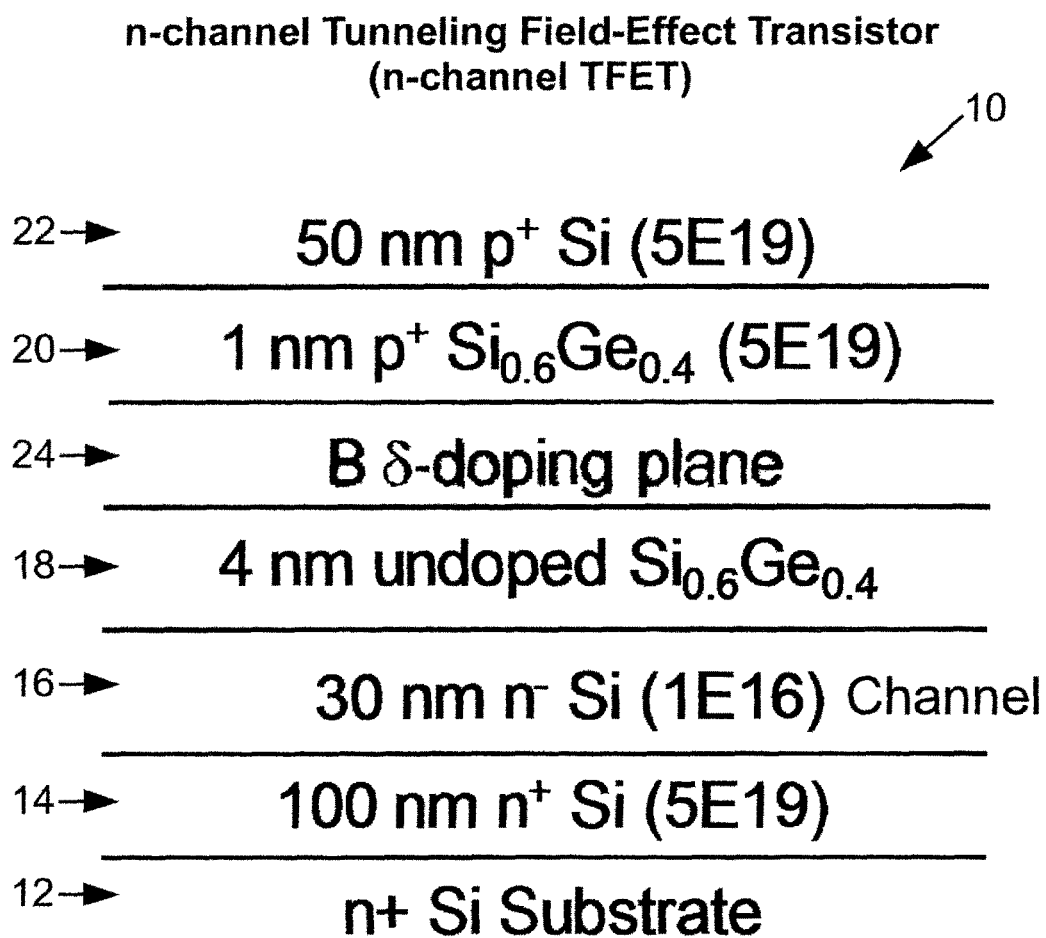
FIG. 2 diagrammatically illustrates a simplified version of the n-channel TFET layer structure of FIG. 1.
Figure 3:
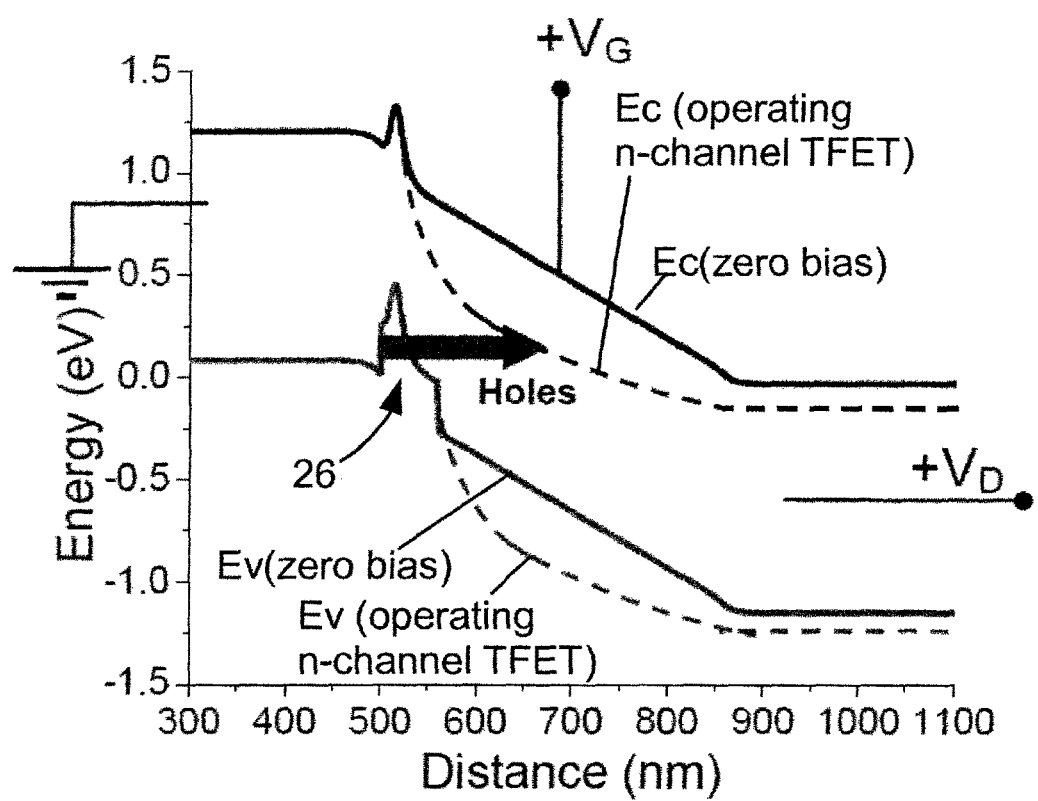
FIG. 3 diagrammatically illustrates a band diagram of the n-channel TFET of FIGS. 1 and 2 under zero bias (solid lines) and under operating n-channel TFET bias (dashed lines).

With reference to FIGS. 1-3, an illustrative n-channel tunneling field-effect transistor (n-channel TFET) 10 is described. FIG. 1 provides an illustrative layer structure including illustrative doping levels (in cm$^{-2}$, denoted "cm−2" in some drawings) and layer thicknesses (in angstroms, denoted "ang" in some drawings), while FIG. 2 provides a simplified layer structure setting forth salient features in thickness units of nanometers and doping concentrations in cm$^{-3}$. The illustrative n-channel TFET is formed on an n$^+$ silicon substrate 12, with an optional growth quality-enhancing n$^+$ silicon buffer 14 grown thereon, thus defining an n-type region of the n-channel TFET. This followed by formation of a channel region 16 which in the illustrated embodiment is 30 nm thick and doped n-type at n=1×10$^{16}$ cm$^{-3}$. A p-type region is formed on the channel region. In the illustrated embodiment the p-type region includes 5 nm of a silicon-germanium alloy 18, 20 having a germanium fraction of 40% capped by a 50 nm silicon cap 22 doped at $5\times10^{19}$. The silicon-germanium alloy layer includes a degenerate doping, for example defined by a boron (B) delta doping (δ-doping) 24 in the illustrated embodiment. In some suitable embodiments, the boron δ-doping 24 is performed using a complete growth stop—that is, deposition of silicon and germanium is temporarily stopped while the dopant source gas continues to flow. Using a complete growth stop, a hole concentration of greater than or about $5\times10^{19}$ cm$^{-3}$, and more preferably about $1\times10^{20}$ cm$^{-3}$ or higher, is achievable in a layer of about 1 nanometer thickness. Instead of a complete growth stop, the silicon germanium deposition can be slowed but not stopped, and/or the silicon germanium deposition can be kept constant and the boron dopant flow (or, more generally, boron dopant precursor flow) substantially increased. In general, the delta doping can extend over a thickness of 1-5 nanometers, although a thicker delta doping is also contemplated. It is to be appreciated that the illustrated doping levels and layer thicknesses and compositions are by way of example, and other doping levels, thicknesses and compositions are also suitable. For example, in some contemplated embodiments the p-type region may contain no germanium. In general, the channel region should be relatively lightly doped compared with the p-type and n-type regions so as to define a p$^+$in doping structure.

With reference to FIG. 3, a band diagram of the n-channel TFET 10 is shown, including the conduction band edge ("Ec") and valence band edge ("Ev"), with the band edges at zero bias shown in solid lines and the band edges of the biased operating n-channel TFET shown in dashed lines. The disclosed n-channel TFET 10 includes the SiGe layer 18, 20 cooperating with the p-type (e.g., boron) delta doping 22 to define a valence band quantum well 26 with a large population of holes near the p$^+$/channel tunneling interface, so that under electrical bias these holes are available to provide fast turn-on at low voltage. A large density of sheet charge at the edge of the channel provided by the valence band quantum well 26 also ensures that the applied source-drain voltage (indicated as voltage "+$V_D$" in FIG. 3, with the source connected to ground) is effectively transferred to the lightly doped channel 16 to enhance tunneling barrier modulation and that the source does not become depleted. As will be discussed, by employing fabrication processes that limit the density of point defects the "off" current can also be kept low, which together with the high "on" current provided by the valence band quantum well and high hole concentration therein provides a high "on" current to "off" current ratio.

Figure 4:
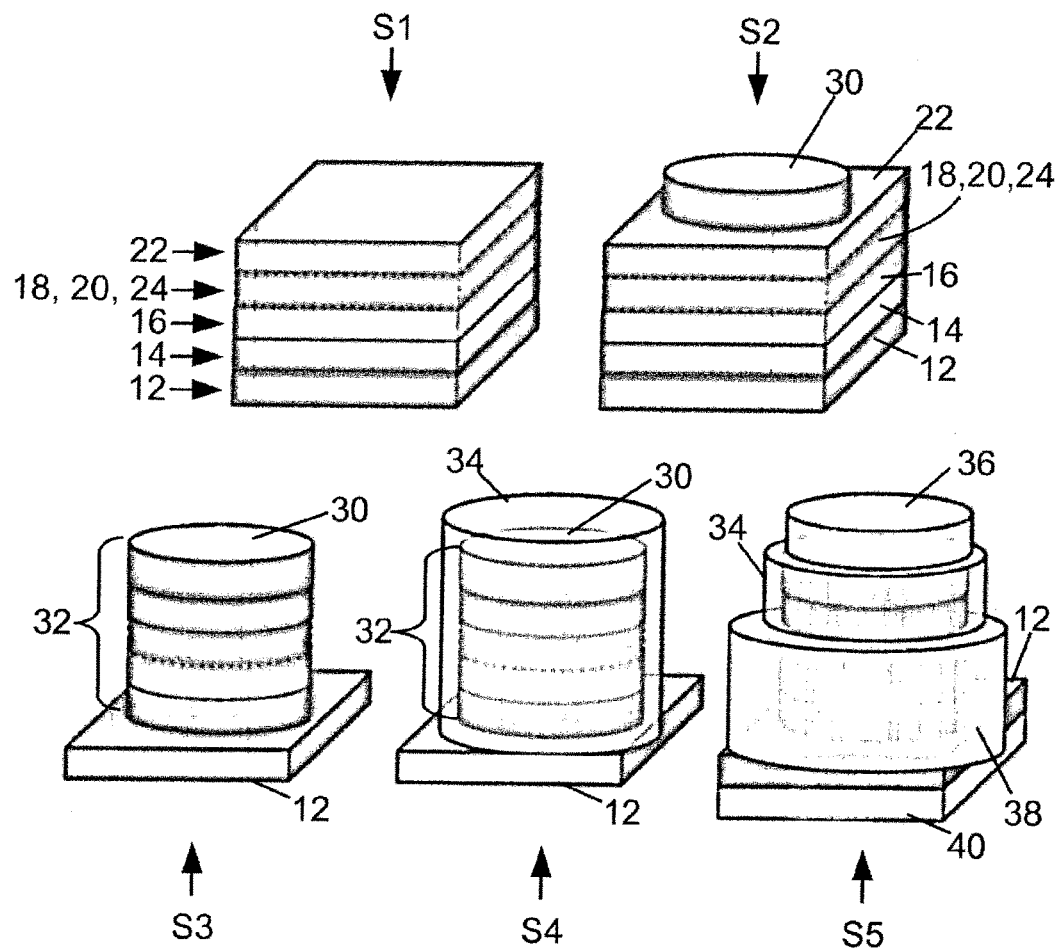
FIG. 4 diagrammatically illustrates a fabrication process for forming the n-channel TFET of FIGS. 1-3.

With reference to FIG. 4, a suitable fabrication process is disclosed for fabricating the n-channel TFET of FIGS. 1-3. FIG. 4 diagrammatically depicts the fabrication process as: (1) a diagrammatic perspective view of the epitaxial growth S1; (2) a diagrammatic perspective view of the epitaxial layers with an upper ohmic contact 30 formed by a lithography/metal ohmic contact fabrication operation S2; (3) a diagrammatic perspective view of a nanopillar 32 comprising the epitaxial layers and the contact 30 on the substrate 12, formed by a plasma etch step S3; (4) a diagrammatic perspective view of the nanopillar 32 coated by a gate dielectric 34 formed by an atomic layer deposition (ALD) step S4; and (5) a diagrammatic perspective view of the completed TFET including a source electrode 36, a gate electrode 38, and a drain electrode 40.

The base layers of silicon and silicon-germanium are formed by a suitable epitaxial growth process in the step S1. In some embodiments, low-temperature molecular beam epitaxy (LT-MBE) is employed, where the low growth temperature (typically employing a growth temperature at or below 400° C. for the critical layers of the p$^+$in structure) reduces atomic interdiffusion that could otherwise smear out dopant profiles and/or reduce compositional abruptness of Si/SiGe interfaces. Although LT-MBE is a suitable growth technique, other epitaxial growth techniques are contemplated, such as chemical vapor deposition (CVD) epitaxial techniques. Based on results achieved for CVD-grown resonant interband tunneling diode (RITD) devices, the presence of a hydrogen ambient in CVD epitaxy is expected to suppress Ge diffusion during growth and thus enable sharp dopant profiles at higher growth temperature (e.g., around 600° C.). Park et al., "Si/SiGe Resonant Interband Tunneling Diodes Incorporating δ-Doping Layers Grown by Chemical Vapor Deposition," *IEEE Electron Device Letters,* 30, pp. 1173-1175 (November 2009). Additionally, and the higher temperature is advantageously expected to reduce point defect concentrations so that the optional post-growth anneal may be less beneficial.

In some embodiments, the epitaxial layer structure is processed by a post-growth anneal, which is believed to improve the "off" current of the TFET by reducing point defect densities in the LT-MBE grown material. In general, annealing the p-channel TFET at a temperature of at least about 500° C. is expected to provide advantageous reduction in point defect density in the LT-MBE grown material. By way of illustrative example, a short (for example, about 1 minute) anneal at a temperature in a range of between about 500° C. and about 850° C. is expected to be effective for reducing the defect density. The post-growth anneal schedule (temperature, time, ramping, and so forth) can be optimized for a specific TFET embodiment. Generally, if the anneal is too high in temperature, or too long, then the dopants can redistribute so as to "smear out" the doping profile, and the advantages of the delta (δ) doping layer for high currents consequently will suffer. It is general, it is expected that time and temperature tradeoffs can be made to optimize the annealed material quality, for example a longer anneal time may enable a reduced anneal temperature or vice versa.

Once the layers are formed and optionally annealed, the ohmic contact 30 is formed on the topmost p$^+$ silicon layer 22 by metal evaporation or another technique in the operation S2, and the mesa or nanopillar 32 is lithographically defined in the operation S3. In the fabrication process diagrammatically illustrated in FIG. 4, the ohmic contact 30 is used as a mask for defining the nanopillar 32; alternatively, a suitable photolithographic or e-beam lithographic definition technique can be employed, for example using a suitable photoresist. The nanopillar 32 is then coated with the suitable high dielectric constant material 34 in the operation S4. In some embodiments, it is contemplated to employ atomic layer deposition (ALD) to apply the gate dielectric 34. In the operation S5, the gate 38 is suitably fashioned by full surface deposition and an etchback process, which is optionally also employed to remove it from the source region on top. A spin-on dielectric, such as benzocyclobutene (BCB), is optionally used to planarize the wafer (not illustrated in FIG. 4). An etchback process is optionally used to cap the mesa or nanopillar with a suitable metal that can be silicided with the top Si once the ALD oxide is removed to form the source electrode 36. The drain is suitably contacted by the illustrated full surface backside contact 40, although other electrical interconnects are also suitable.

The foregoing device fabrication process is merely illustrative, and other microfabrication techniques can be used to isolate and electrically contact a p$^+$in diode mesa or nanopillar from the silicon/SiGe layer structure formed by LT- MBE or the like. Additionally, it is contemplated to integrate the post-growth anneal for defect density reduction into the device fabrication process. By way of example, a singular anneal may be used to provide both alloying of a deposited ohmic contact layer and defect density reduction.

Reduced doping levels in the δ-doping layers, such as may result from outdiffusion of the boron (B) delta doping, are expected to lower the electric field and reduce the tunneling probability and therefore current density. As seen in FIGS. 1 and 2, the boron δ-doping layer 24 is housed inside the Ge-containing quantum well (QW) layer 18, 20. The SiGe layer 18, 20 has a larger relaxed lattice constant than silicon—accordingly, the $Si_{0.6}Ge_{0.4}$ layer 18, 20 is compressively strained, which reduces the density of interstitials. Since boron (B) is an interstitial diffuser, the reduced density of interstitials in the SiGe layer 18, 20 advantageously suppresses boron outdiffusion. The band diagram of FIG. 3 illustrates asymmetry in the valence band QW 26 of the illustrative n-channel TFET 10. This asymmetry serves to place a substantial amount of weighted average Ge within the tunneling spacer 18, while reserving the illustrative 1 nm thick layer 20 outside the boron δ-doping spike 24 to suppress boron outdiffusion away from the channel 16. A 1 nm thick SiGe layer ensures that it is continuous given that some islanded growth may occur due to strain, but the low growth temperature of the LT-MBE should suppress this tendency to become islanded.

Figure 6:
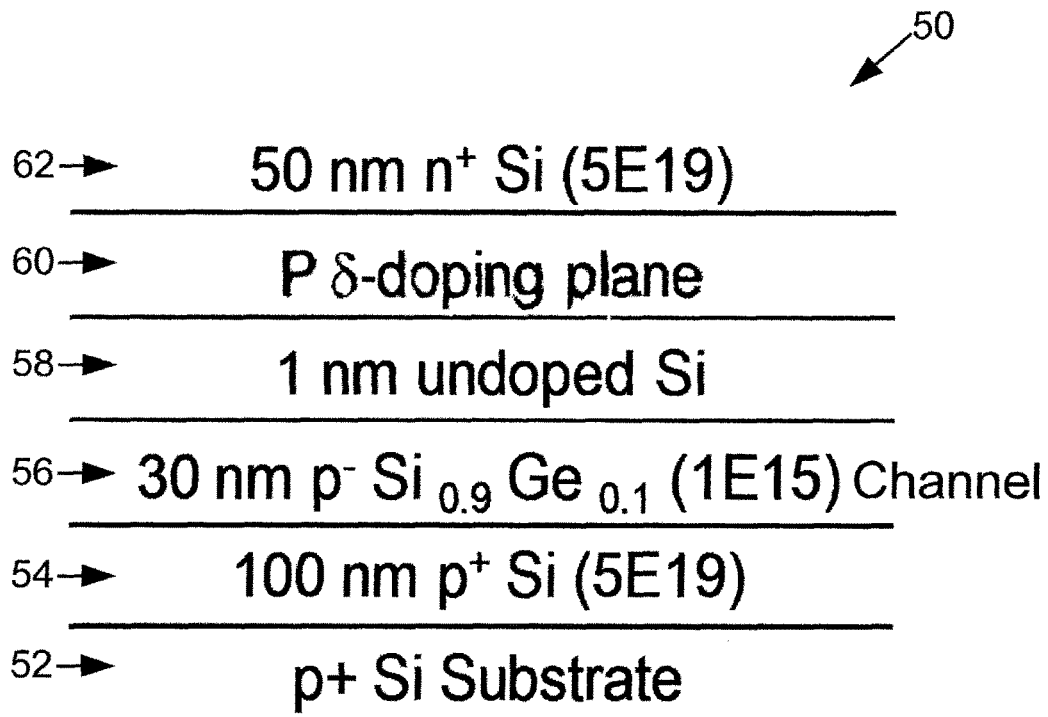
FIG. 6 diagrammatically illustrates a simplified version of the p-channel TFET layer structure of FIG. 5.
Figure 7:
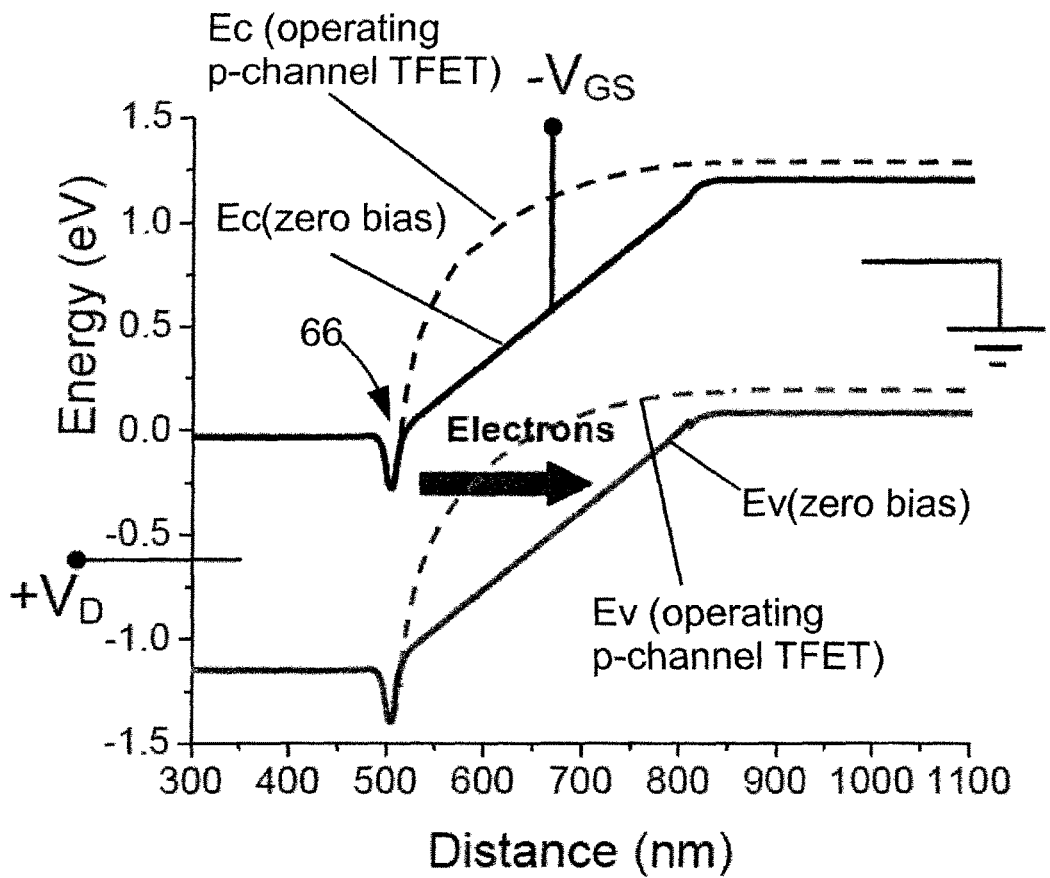
FIG. 7 diagrammatically illustrates a band diagram of the p-channel TFET of FIGS. 5 and 6 under zero bias (solid lines) and under operating n-channel TFET bias (dashed lines).

With reference to FIGS. 5-7, an illustrative p-channel tunneling field-effect transistor (p-channel TFET) 50 is described. FIG. 5 provides an illustrative layer structure including illustrative doping levels (in $cm^{-2}$) and layer thicknesses (in angstroms), while FIG. 6 provides a simplified layer structure setting forth salient features in thickness units of nanometers and doping concentrations in $cm^{-3}$. The illustrative p-channel TFET 50 is formed on an $p^+$ silicon substrate 52, with an optional growth quality-enhancing $p^+$ silicon buffer 54 grown thereon, thus defining an p-type region of the p-channel TFET. This followed by formation of a channel region 56 which in the illustrated embodiment is 30 nm thick and doped p-type at $p=1\times10^{15}$ $cm^{-3}$. To enhance hole mobility, the channel region 56 of the illustrative p-channel TFET 50 is formed of a low Ge fraction alloy, such as a $Si_{0.9}Ge_{0.1}$ layer of thickness about 30 nm in the illustrated embodiment. Advantageously, for this relatively low Ge fraction the 30 nm thickness of the channel region 56 is within critical thickness limitations. A tradeoff can be made between Ge fraction and channel length, with lower Ge fraction generally being used for longer channel lengths, so as to keep the SiGe channel region below the critical thickness for dislocation formation. It is also contemplated in some embodiments for the channel to include no germanium.

With continuing reference to FIGS. 5-7, in the illustrative p-channel TFET an n-type region is formed on the SiGe channel region. In the illustrated embodiment the n-type region includes a thin nominally undoped silicon spacer layer 58 followed by an n-type phosphorus (P) delta doping 60 followed by a 50 nm $n^+$ silicon cap 62 doped at $n=5\times10^{19}$. In some suitable embodiments, the phosphorus δ-doping 60 is performed using a complete growth stop—that is, deposition of silicon is temporarily stopped while the dopant source gas continues to flow. Using a complete growth stop, a conduction band electron concentration of greater than or about $5\times10^{19}$ $cm^3$, and more preferably about $1\times10^{20}$ $cm^{-3}$ or higher, is achievable in a layer of about 1 nanometer thickness. Instead of a complete growth stop, the silicon deposition can be slowed but not stopped, and/or the silicon deposition can be kept constant and the phosphorus dopant flow (or, more generally, phosphorus dopant precursor flow) substantially increased. In general, the delta doping can be over a thickness of 1-5 nanometers, although a thicker delta doping is also contemplated. It is again to be appreciated that the illustrated doping levels and layer thicknesses and compositions are by way of example, and other doping levels, thicknesses and compositions are also suitable. In general, the SiGe channel region 56 should be relatively lightly doped compared with the p-type and n-type regions so as to define a $p^+in$ doping structure.

With reference to FIG. 7, a band diagram of the p-channel TFET 50 is shown, including the conduction band edge ("Ec") and valence band edge ("Ev"), with the band edges at zero bias shown in solid lines and the band edges of the biased operating p-channel TFET shown in dashed lines. The illustrative p-channel TFET of FIGS. 5-7 includes a conduction band quantum well 66 at the interface between the n-region 54 and the SiGe channel region 56. In the case of the n-channel TFET (FIGS. 1-3) the valence band quantum well 26 was formed on the p-side by a combination of Ge and delta doping. However, controlled formation of the analogous conduction band quantum well 66 in the p-channel TFET 50 is substantially more complicated.

First, the Si/SiGe material system does not exhibit a large conduction band offset. Accordingly, the conduction band quantum well 66 of the p-channel TFET 50 of FIGS. 5-7 is primarily defined by the n-type phosphorus (P) δ-doping spike 60. In other words, the n-type phosphorus (P) δ-doping spike 60 performs both functions of: (i) generating the conduction band quantum well 66; and (ii) providing electrons to fill the conduction band quantum well. During p-channel TFET operation these electrons provide an electron tunnel current, as diagrammatically indicated in FIG. 7.

Second, n-type δ-doping with phosphorus (P) (as in the case of the p-channel TFET 50 of FIGS. 5-7) is more problematic as compared with p-type δ-doping with boron (as in the n-channel TFET 10 of FIGS. 1-3). Unlike boron, which is an interstitial diffuser in the silicon/SiGe system, phosphorus is generally a vacancy mediated diffuser in the silicon/SiGe system. In the n-channel TFET 10 embedding the boron delta doping in the SiGe layer 18, 20 reduces interstitials and hence suppresses boron outdiffusion; in sharp contrast, the presence of SiGe in the n-region 58, 62 of the p-channel TFET 50 would likely enhance outdiffusion of the phosphorus delta doping 60. Therefore the thin undoped Si layer 58 (about 1 nm thick) is employed in the illustrative p-channel TFET 50 to separate the n-type phosphorus (P) δ-doping spike 60 and the SiGe channel 56.

In sum, it is recognized herein that for the p-channel TFET 50 there is no benefit to adding Ge to the n-region 58, 62, because: (i) it does not contribute to formation of the conduction band quantum well 66; and (ii) it would likely enhance outdiffusion of the n-type dopant. This is to be compared with the n-channel TFET 10, for which inclusion of SiGe 18, 20 in the p-region is beneficial because it both: (i) contributes to formation of the valence band quantum well 26; and (ii) suppresses outdiffusion of the p-type dopant.

On the other hand, it is recognized herein that inclusion of a low Ge fraction in the channel region 56 of the p-channel TFET 50 has the advantage of enhancing carrier mobility, and is therefore beneficial so long as provision is made to keep the Ge in the channel 56 separated from the n-type phosphorus (P) delta doping 60, for example using the illustrative 1 nm silicon spacer layer 58 as in the illustrative p-channel TFET 50 of FIGS. 5-7.

The illustrative n-channel TFET 10 of FIGS. 1-3 does not include Ge in the channel 16; however, it is also contemplated to include a small fraction of Ge in the channel region of the n-channel TFET device in order to increase electron mobility, in analogy to the illustrated p-channel TFET 50.

The disclosed n-channel TFET 10 includes the SiGe layer 18, 20 cooperating with the p-type (e.g., boron) delta doping 24 to define a valence band quantum well 26 with a large population of holes near the p+/channel tunneling interface, so that under electrical bias these holes are available to provide fast turn-on at low voltage. A large density of sheet charge at the edge of the channel 16 provided by the valence band quantum well 26 also ensures that the applied source-drain voltage (denoted "+$V_D$" in FIG. 3, with the source connected to electrical ground) is effectively transferred to the lightly doped channel 16 to enhance tunneling barrier modulation and that the source does not become depleted. As will be discussed, by employing fabrication processes that limit the density of point defects the "off" current can also be kept low, which together with the high "on" current provided by the valence band quantum well 26 and high hole concentration therein provides a high "on" current to "off" current ratio.

Figure 8:
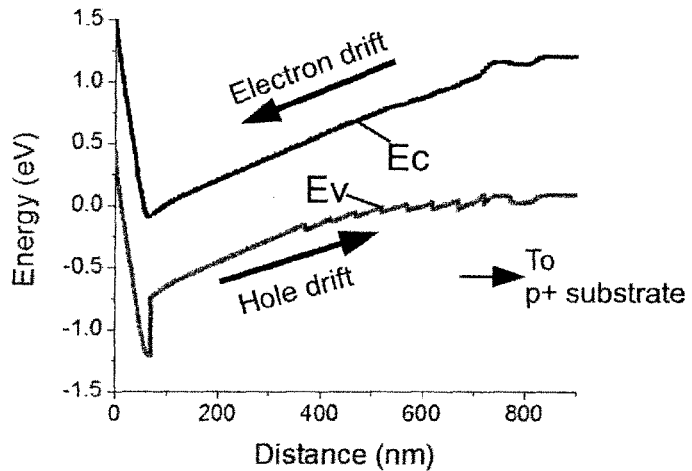
FIG. 8 diagrammatically illustrates a band diagram (top) and layer structure (bottom) for a variant p-channel TFET including a graded SiGe channel.

With reference to FIG. 8, a band diagram (top) and layer structure (bottom) are shown for a variant p-channel TFET 50' including a graded SiGe channel 56' that provides added Ge percentage for higher hole mobilities. By using a graded SiGe channel 56', Ge percentage can be added to obtain higher hole mobilities without concurrently introducing a valence band discontinuity at the drain end that would impede hole collection. Further, the enhanced Ge percentage near to the source lowers the barrier for tunneling into the SiGe and thereby boosts the "on" current. A slight offset of the SiGe from the n+ source is expected to reduce n-type dopant outdiffusion and provide a sharper doping profile. The design of FIG. 8 exceeds the critical thickness for SiGe on a Si substrate, and additionally the p-type region is not accurately simulated (this is believed to be due to an anomalous 5 nm p-type silicon layer at the surface introduced by the Poisson simulator). However, it is readily apparent that by grading the channel 56' from lower Ge content at the p-side of the channel to higher Ge content at the n-side of the channel the conduction band (Ec) and valence band (Ev) are both shaped to prevent any valence band discontinuity while raising the effective channel hole mobility. FIG. 8 illustrates the end-point case of grading from pure silicon (i.e., 0% Ge) at the p-side of the channel 56' to pure germanium (i.e., 100% Ge) at the n-side of the channel 56'. In view of critical thickness considerations, a lower monotonic compositional grade is also contemplated, for example a grade from pure silicon (or lower Ge fraction silicon germanium) proximate to the p-side of the channel and monotonically increasing in Ge fraction to $Si_{1-x}Ge_x$ proximate to the n-side of the channel, where the Ge fraction x is a value less than unity but large enough to provide a substantial hole mobility boost in the channel.

The p-channel TFET fabrication process is substantially the same as that depicted in FIG. 4 for the n-channel TFET, except that a Si/SiGe layer structure suitable for forming the p-channel TFET is formed by LT-MBE or another suitable epitaxial growth process and the metallizations are suitably chosen to make ohmic contact with the respective doping type.

It is to be understood that the delta dopings 24, 60 of the illustrative p-channel and n-channel TFETs 10, 50 define thin degenerately doped layers. More generally, any such delta doping is optionally replaced by a thin degenerately doped layer of the relevant doping type which may or may not be a "true" delta doping formed during a growth interruption. Said another way, the term "delta doping" as used herein is intended to encompass not only a "true" delta doping which entails a growth stop, but also a thin degenerately doped layer such as may be formed (by way of another example) by reducing the growth rate and/or substantially increasing the dopant flux (or dopant precursor flow in the case of a chemical deposition technique).

It will be appreciated that the n-channel TFET 10 of FIGS. 1-3 and the p-channel TFET 50 of FIGS. 5-8 can each be optimized respective to n-channel TFET and p-channel TFET performance. With both n-channel and p-channel TFET devices available, it is contemplated to construct complementary logic circuitry (i.e., "C-TFET" circuitry) analogous to CMOS circuitry of the MOSFET topology.

Figure 9:
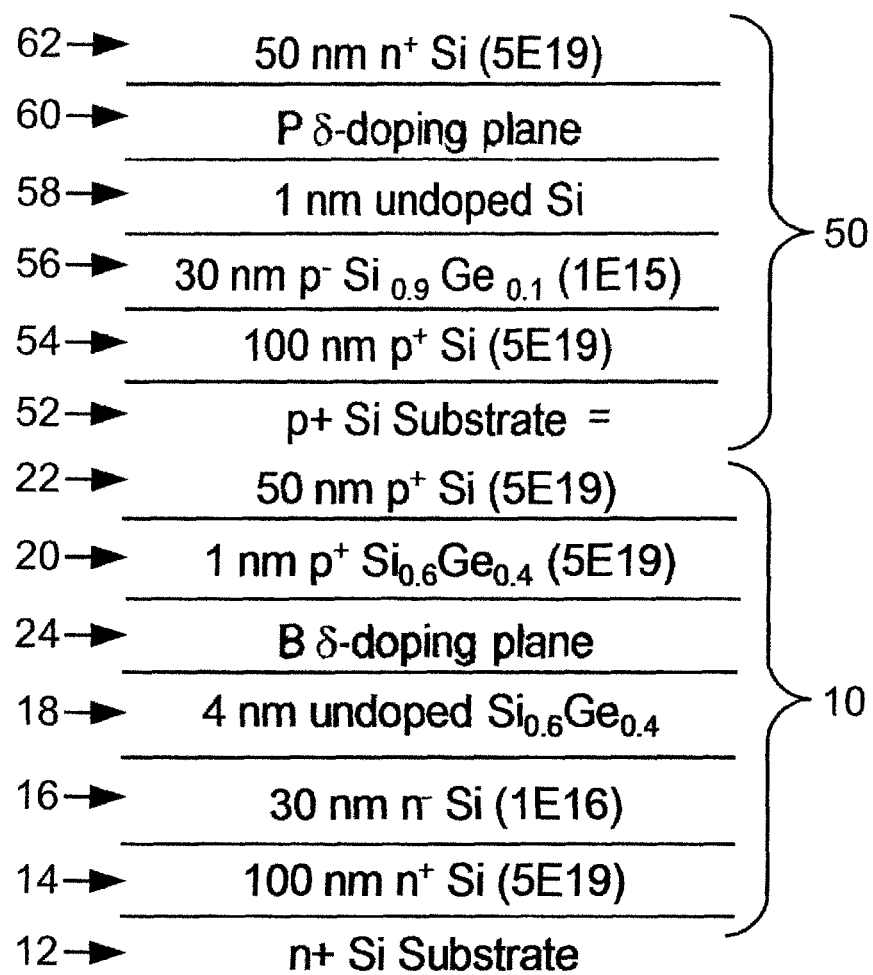
FIG. 9 diagrammatically illustrates a complementary logic circuit constructed using the n-channel TFET of FIGS. 1-4 and the p-channel TFET of FIGS. 5-7.

For example, as illustrated in FIG. 9, one approach for a C-TFET topology entails depositing the layers of the n-channel TFET device 10 of FIGS. 1-2, terminating with the capping p+ silicon layer 22 which then also serves as the (virtual) p+ silicon substrate 52 for layers of the p-channel TFET device 50 of FIGS. 5 and 6 which are grown atop the n-channel TFET device 10. Optionally, the capping p+ silicon layer 22 of the n-channel TFET device 10 of FIGS. 1-2 is thickened to provide an improved virtual substrate for the p-channel TFET device 50 of FIGS. 5 and 6. Device fabrication of FIG. 4 for the n-channel TFET 10 devices is modified in that the uppermost layers of the p-channel TFET device 50 are also etched away in defining the mesa or nanopillar. Device fabrication for the p-channel TFET devices 50 is substantially unmodified, except that the "backside" ohmic contact is made to the (optionally thickened) capping p+ silicon layer 22 of the n-channel TFET device layers. Device isolation is suitably obtained by etching isolation trenches (not shown) to laterally isolate n-channel and p-channel devices 10, 50. It is also contemplated to employ ion implantation and/or suitable epitaxy to define an insulative layer between the lower TFET device layers of FIGS. 1-2 and the upper p-channel TFET device layers of FIGS. 5 and 6. The n-channel and p-channel TFET devices 10, 50 can be electrically interconnected to form complementary (C-TFET) circuitry using the same interconnect topologies used to interconnect p-MOS and n-MOS transistors in CMOS topologies.

Some additional embodiments and experimental results are set forth next.

The 3-terminal Si/SiGe quantum tunneling transistors for steep subthreshold slopes disclosed herein provide a paradigm shift from standard MOSFET topologies, where temperature effects limit the slope to 60 mV/decade, towards tunneling based incarnations in which tunneling is virtually temperature independent. The disclosed n-channel and p-channel TFETs provide concurrent high ON currents, low OFF currents and subthreshold slopes below 60 mV/decade.

Tunneling field effect transistors (TFET) are a scalable platform for sub-10 nm devices with reduced short channel effects and steep subthreshold slopes.

Embodiments of tunnel FETS disclosed herein are vertically oriented and advantageously include abrupt interface control through epitaxial growth. A vertical orientation also permits high density circuits. Planar fabrication techniques are limited by lithographic limitations, implant straggle and diffusion. The usage of low temperature molecular beam epitaxy (LT-MBE) as disclosed herein enables hyperabrupt junctions which are disclosed herein to be advantageous for achieving high ON currents. Concurrent control of defects is disclosed herein to be advantageous to concurrently achieve low OFF state currents.

Embodiments of both n-channel and p-channel TFETs are disclosed herein, together with underlying materials growth and device design and processing embodiments. Although the TFET embodiments described herein as illustrative examples employ the silicon-germanium material system, it is contemplated to fabricate analogous TFET devices in other material systems enabling suitable bandgap and doping control, such as binary, ternary, quaternary, or other III-V compound semiconductor materials which advantageously exhibit higher low-field mobilities and saturation velocities as compared with the illustrative silicon germanium system. By way of illustrative example, the disclosed TFETs are also contemplated to be fabricated in indium-containing alloys in the indium-gallium-arsenide III-V material system (e.g., InAs, GaAs, AlAs, InGaAs, InAlGaAs, various multilayer and/or graded layer combinations thereof, or so forth), or in indium-containing alloys in the indium-gallium-antimonide III-V material system (e.g., InSb, GaSb, AlSb, InGaSb, InAlGaSb, various multilayer and/or graded layer combinations thereof, or so forth), and et cetera.

Additional understanding can be gained by considering 2-terminal tunnel diodes, called resonant interband tunnel diodes (RITD), which exhibit negative differential resistance (NDR) that facilitates a shift towards compact RITD-FET hybrid circuits with reduced device count and reduced power consumption. These RITD designs are compatible with MOSFET processing. The layer structures of these RITD devices have some similarities to layer structures of disclosed illustrative TFET devices; however, the RITD devices are diode devices which do not include a gate terminal and are not suitable for use as transistor devices.

Figure 10:
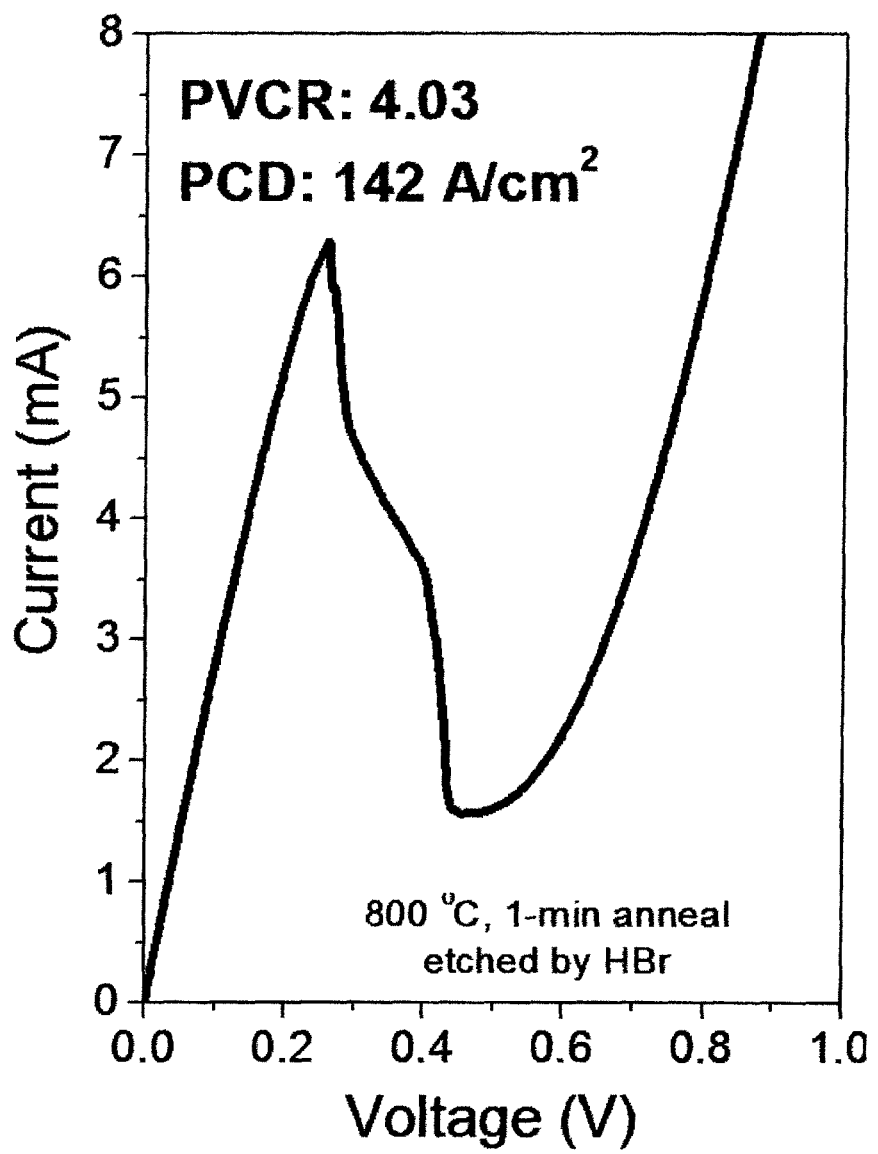
FIGS. 10-12 set forth data for resonant interband tunneling diode (RITD) devices.
Figure 11:
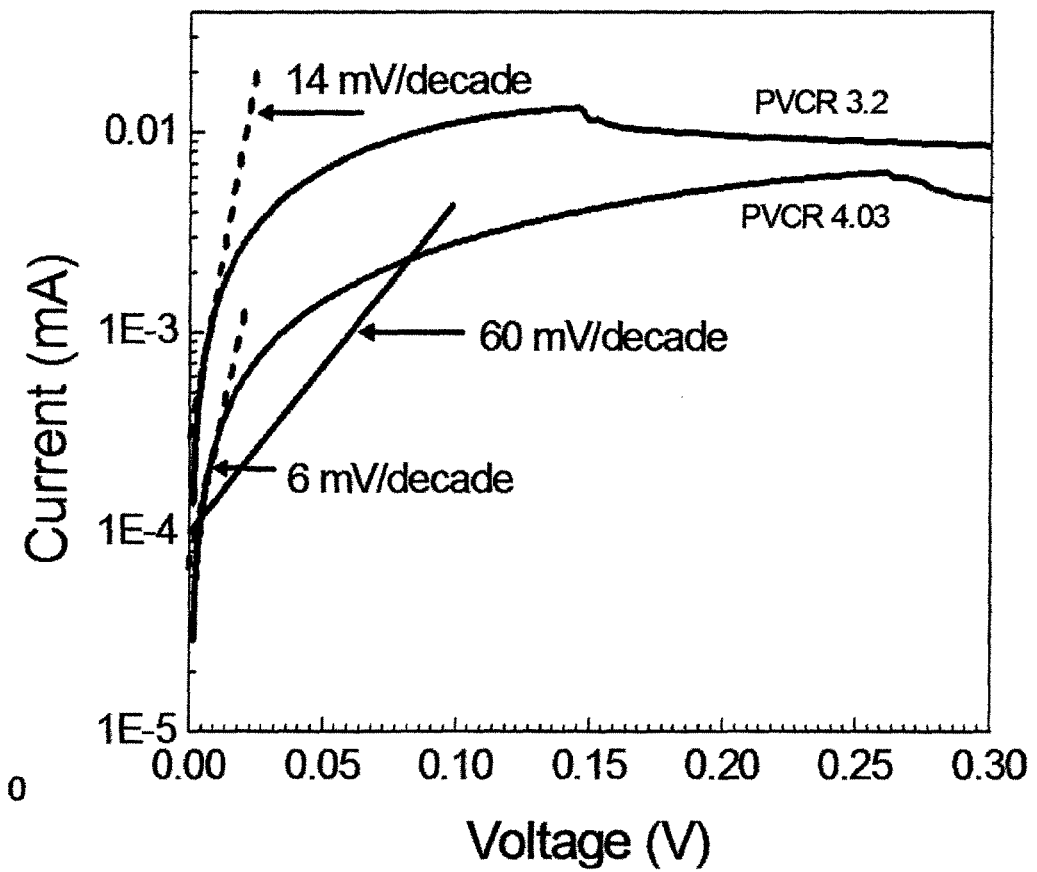

With reference to FIGS. 10 and 11, these RITDs have been shown to exhibit very robust NDR with state-of-the-art peak-to-valley current ratios (PVCR) at room temperature. The RITD's current for these illustrative RITD devices peaks at about 0.1-0.2V, which is abrupt and limited by the tunneling current component. Shown in FIG. 11 is a log I-V characteristic which indicates that the sub-threshold slope of a 3-terminal TFET (having labeled PVCR=3.2) can be as low as 14 mV/decade. Overlaid in the same plot of FIG. 11 is another RITD design (having labeled PVCR=4.03) that indicates a subthreshold slope as low as 6 mV/decade. These are 2-terminal devices, and adding a gate (as in a TFET) would likely increase the slope.

Figure 12:
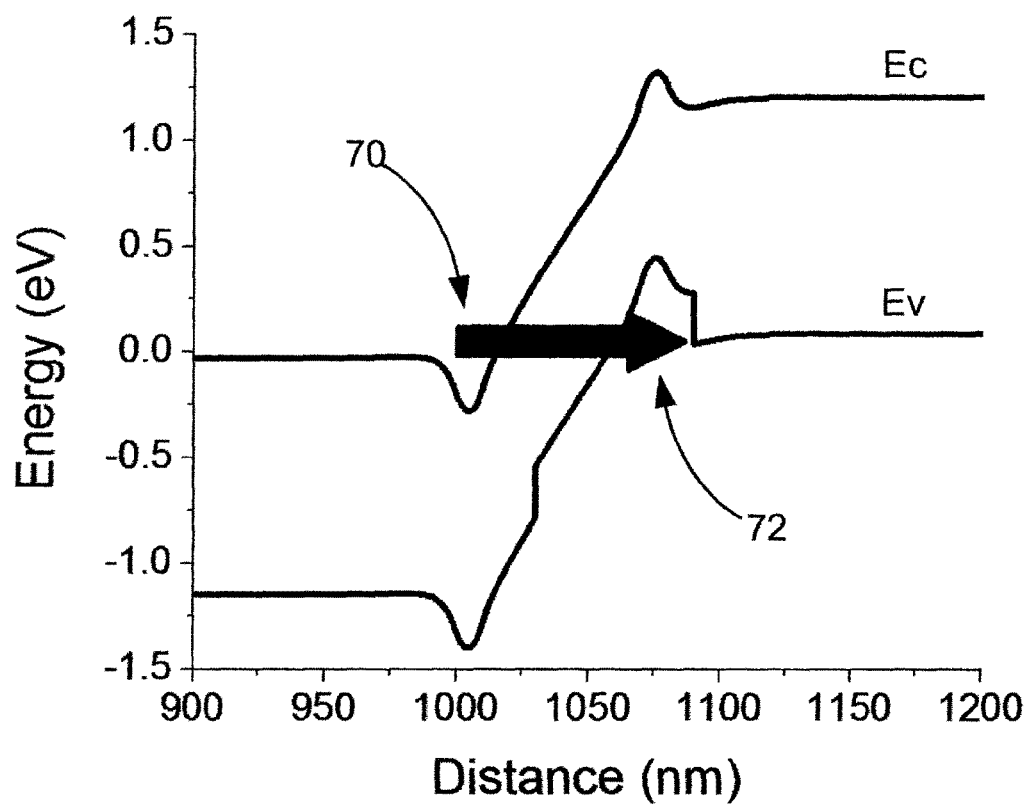

With reference to FIG. 12, a band diagram of this RITD shows two quantum wells (QW), namely a conduction band QW 70 and a valence band QW 72, closely spaced which serve as reservoirs of bound charge for tunneling across the p-n junction. The resonant tunneling aspect from QW to QW decreases the subthreshold slope. RITD experimental data show that the deeper and more abrupt these QWs 70, 72 are, the higher the peak tunneling current and the steeper the slope. The steep subthreshold slope is expected to be maximized by the resonant-like tunneling from a QW to the bulk channel region. RITD studies suggest improvements gained by 2D-to-2D tunneling, and 2D-to-3D tunneling if QW confinement is lost on one side. The lowest current densities for RITDs were obtained when the tunneling shifted to Esaki-like 3D-to-3D tunneling.

Epitaxy and/or device processing that is performed in a manner that permits substantial diffusion or intermixing is believed to destroy the resonant tunneling process by smearing out the doping profiles and losing quantum confinement. Given the same bandgap and effective masses, the tunnel diode quality is lowered. Partially this is due to a reduction in the electric field in the narrow tunneling spacer, leading to a reduced tunneling probability through the triangular barrier.

Figure 13:
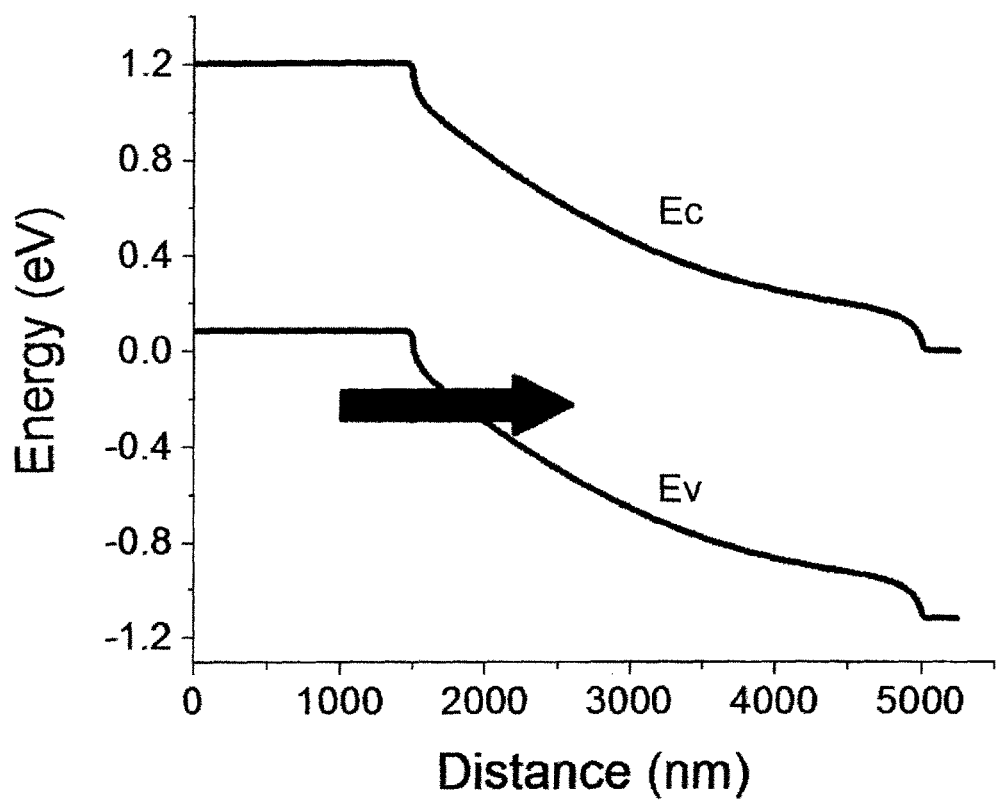
FIG. 13 diagrammatically illustrates a band diagram of a silicon p$^+$-n$^-$ TFET.

With reference to FIG. 13, a band diagram of a silicon $p^+$-$n^-$ is shown. Band-to-band tunneling can occur as the source-drain bias is increased making the right side of the bands bend downward, thereby narrowing the tunnel barrier. The triangular barrier reduction permits carrier tunneling from the source's valence band to the channel's conduction band, followed by transport down the channel. The exponential rise in current with barrier narrowing promotes an abrupt turn-on. The TFET can also be turned on by the channel formation induced below the gate oxide in the lightly doped n– with applied gate bias, which will also narrow the tunnel barrier. However, the lack of a well defined valence band QW as an ample source of holes will severely limit the performance of this configuration.

It is disclosed herein that such deleterious effects can be reduced by including a suitable δ-doping layer, and/or by using low-temperature molecular beam epitaxy (LT-MBE) to suppress dopant and Ge diffusion and segregation that otherwise may smear out the junction, rendering the tunneling phenomenon less than optimal.

Both n-channel TFET (e.g., FIGS. 1-3) and p-channel TFET (e.g., FIGS. 5-8) embodiments are disclosed herein. Novel device designs are disclosed together with fabrication techniques that combine low temperature epitaxial growth techniques that control doping profiles and provide interface control and post-growth processing. Unlike traditional Si processing that is additive, the TFETs disclosed herein are formed using an approach more reminiscent of III-V compound semiconductor fabrication technologies, which is a subtractive process following the creation of a multilayer stack by epitaxy.

Interband tunneling is generally considered to be a bipolar current. However, the TFET embodiments disclosed herein operate by unipolar transport, analogous to traditional MOSFETs but in a vertical geometry. The geometry expressed by the band diagrams set forth herein (e.g., FIGS. 3 and 7), illustrate with the arrows labeled "Holes" in FIG. 3 (for the n-channel TFET 10) and labeled "Electrons" in FIG. 7 (for the p-channel TFET 50) that the tunneling from the respective QW reservoirs 26, 66 behaves more like a Fowler-Nordheim tunneling. The channel region 16, 56 will be depleted of most free charge by the source-drain voltage and light doping except the charges which tunnel into it from the source. This current component will largely be unipolar, thereby preserving the characteristics sought for TFETs as a suitable replacement to MOSFET technology.

The TFET design embodiments disclosed herein as illustrative examples suitably utilize a combination of photolithography and electron beam lithography (EBL) to direct-write test structures. The EBL can write photomasks once the device layout becomes finalized for the larger features, such as contact pads. The TFET is suitably principally defined by a narrow mesa, or a nanopillar (e.g., the nanopillar 32 diagrammatically shown in FIG. 4), by lithography and etched using inductively-coupled reactive ion etching or another etching technique. Atomic layer deposition (ALD) is optionally used to facilitate conformal coating of the mesa or nanopillar with a suitable high-k dielectric (e.g., the gate dielectric 34 diagrammatically shown in FIG. 4). The gate 38 is suitably fashioned by full surface deposition and an etchback process, which is optionally also employed to remove it from the source region on top. A spin-on dielectric, such as benzocyclobutene (BCB), is optionally used to planarize the wafer. An etchback process is optionally used to cap the mesa or nanopillar with a suitable metal 36 that can be silicided with the top Si 22 once the ALD oxide is removed. The drain is suitably contacted by the illustrated full surface backside contact 40, although other electrical interconnects are also suitable.

With reference back to FIGS. 1-3, the disclosed illustrative n-channel TFET 10 is illustrated by way of a band diagram in FIG. 3, and includes: (i) the usage of the SiGe quantum well 26 and (ii) the suitably placed p-type (e.g., boron) δ-doping layer 24 inside this SiGe QW 26. The deep QW 26 serves to create a large population of holes available for tunneling to the n-channel region 16. Also, a large density of sheet charge at the edge of the channel 16 ensures that the applied source-drain voltage (+$V_D$ in FIG. 3) is effectively transferred to the lightly doped channel 16 to enhance tunneling barrier modulation and that the source does not become depleted. The source-drain can be controlled by the epitaxial growth to monolayer control.

For good TFET operation, it is advantageous to create a high drive current. However, tunneling through a barrier can limit the current magnitude. To effectively raise the current density of tunneling current, four issues are considered herein which are related to factors governing tunneling. Using a Wentzel-Kramers-Brillouin (WKB) approximation, tunneling through the forbidden bandgap can be treated as tunneling through a barrier. The tunneling probability $T_t$ of this triangular barrier is given by the following equation:

$$T_t \approx \exp\left(-\frac{4\sqrt{2m^*}E_g^{3/2}}{3q\hbar\mathscr{E}}\right), \quad (1)$$

where m* is the effective mass of the tunneling charge carriers (holes for the n-channel TFET 10, electrons for the p-channel TFET 50), $E_g$ is the bandgap, q=1.602×10$^{-19}$ C is the carrier (hole or electron) charge, is the reduced Planck's constant (Planck's constant h=2π) and $\mathscr{E}$ is the electric field.

As disclosed herein, the drive current can be increased by the following approaches.

First, the triangular barrier can be reduced by reducing the bandgap $E_g$. The insertion of thin Ge containing layers is useful to achieve this in the Si/SiGe material system. Other reduced bandgap materials or alloys are suitably used in other material systems, such as indium containing alloys (e.g., InGaAs or InAs) in the indium-gallium-arsenide III-V material system, or indium containing alloys (e.g., InGaSb or InSb) in the indium-gallium-antimonide III-V material system, or so forth. The insertion of such barrier-reducing material may be limited by critical thickness considerations. For example, in a silicon-germanium multilayer structure grown on a silicon substrate, a too-thick Ge-containing layer, and/or a Ge-containing layer of too high Ge fraction, could lead to dislocation formation that could degrade or destroy TFET device performance. Accordingly, the total amount of germanium is limited by thickness and/or Ge fraction when using a Si-substrate. Analogous considerations apply to the concentration/thickness of In-containing layers in the indium-gallium-arsenide III-V material system employing an InP, GaAs or Ge substrate. Additionally or alternatively, a relaxed SiGe buffer technology (or analogous technology in another material system, such as a relaxed InGaAs buffer technology) may be used to accommodate a higher amount of germanium in the TFET.

Second, the effective mass m* may be reduced. By adding Ge to the tunneling barrier, the effective mass is advantageously reduced. It is also contemplated to employ strain effects to further reduce this effective mass. Such strain may advantageously be introduced by adding Ge, so long as the Ge-containing material remains coherently strained.

A third factor, not captured by Equation (1), is the participation of phonons in the tunneling process with the usage of indirect bandgap materials such as silicon and germanium and alloys thereof. Phonon participation generally lowers tunneling probability $T_t$, and generates a finite slope to the turn-on behavior, thereby raising the subthreshold slope. It is recognized herein that a Ge-containing layer housed inside the tunneling barrier reduces the role of intermediary phonons. This is because the Γ-valley of Ge is only slightly higher than the L-valley. Thus, at high fields and high doping, the Γ-valley of the Ge-containing layers becomes populated, making it more quasi-direct bandgap and thereby bypassing the participation of phonons altogether.

A fourth factor is the creation of a high electric field $\mathscr{E}$ across the tunneling barrier. Toward this end, the two δ-doping layers 70, 72 shown in FIG. 12 are used in RITD designs, and high doping levels at the "p" and "n" regions of the p$^+$in TFET structure is useful for this reason as well in the TFET embodiments 10, 50, 50' disclosed herein. In some embodiments, a sub-monolayer of δ-doping (e.g., the illustrative p-type delta doping 24 in the n-channel TFET 10, or the illustrative n-type delta doping 60 in the p-channel TFET 50) is suitably inserted with a sheet carrier concentration of (by way of example) 1×10$^{14}$ cm$^{-2}$, which equates to over 1×10$^{20}$ cm$^{-3}$ carrier concentration using LT-MBE distributed over a waist of about 1 nm. The temperature for deposition of the δ-doping region is preferably low, for example about 320° C. which is sufficient to suppress dopant diffusion and segregation. The dopant species in this case are active and are not expected to require an activation anneal, although such an anneal is optionally applied after the LT-MBE growth. Reduced doping levels in the δ-doping layers will lower the electric field $\mathscr{E}$ and reduce the tunneling probability T and therefore current density. In the case of the n-channel TFET 10, the δ-doping layer should be housed inside the Ge-containing QW layer 18, 20, as the inclusion of Ge to the Si lattice compressively strains the lattice and reduces the density of interstitials. Since boron (B) is an interstitial diffuser, the removal of interstitials suppresses boron outdiffusion. The band diagram of FIG. 3 illustrates the asymmetry in the valence band QW accordingly. The asymmetry serves to place the maximum amount of weighted average Ge within the tunneling spacer 18, while reserving the 1 nm thick layer 20 outside the δ-doping spike 24 to prevent boron from outdiffusing away from the channel 16. The 1 nm thickness of the SiGe layer 20 ensures that it is continuous given that some islanded growth may occur due to strain, but the low growth temperature should suppress this tendency to become islanded.

Another parameter of interest is the low OFF state current of a TFET. In tunnel diodes, this is termed the "excess current" and is basically considered to be a third current component occupying all the measured current that is in excess of the combination of the forward biased tunneling and diffusion currents. This is the finite current in FIG. 10 around 0.5V. The source of this excess current is generally attributed to defect-related tunneling. Thus, any point defects or dislocations in the vicinity of the tunneling barrier will elevate this undesired current. Like the phonon participation, this current component would smear out a steep subthreshold slope. The usage of low growth temperatures facilitates achieving sharp doping profiles that provide high tunneling probability and currents. However, the reduced substrate temperature that enables sharp interfaces and doping profiles also reduces the ability of adatoms to move in a correlated manner on the growth surface. If the layers deposited are too thick, then the growing layer can even become amorphous. More generally, reduced adatom mobility tends to enhance the concentration of point defects. It is recognized herein that a post-growth anneal can effectively reduce the point defect density in TFET devices. By way of example, a short (for example, about 1 minute) anneal at a temperature in a range of between about 500° C. and about 850° C. is expected to be effective for reducing the defect density. The post-growth anneal schedule (temperature, time, et cetera) can be optimized for a specific TFET embodiment. Generally, if the anneal is too high in temperature, or too long, then the dopants can redistribute so as to "smear out" the doping profile, and the advantages of the δ-doping layer for high currents consequently will suffer.

With reference back to FIG. 5-8, p-channel TFET devices 50, 50' are also disclosed herein. These p-channel TFETs 50, 50' can be connected with n-channel TFETs 10 (as shown diagrammatically in FIG. 9) to create complementary logic circuits analogous to C-MOS circuitry. The band diagram for the illustrative p-channel II-ET 50 is shown in FIG. 7. The p-channel TFET has some similarity with the n-channel TFET, but there are substantial differences as well. For greater hole mobility, the channel region 56 of the illustrative p-channel TFET 50 is formed of a low Ge fraction alloy, namely the illustrative $Si_{0.9}Ge_{0.1}$ layer 56 of thickness about 30 nm Advantageously, for this relatively low Ge fraction the 30 nm channel region thickness is within critical thickness limitations.

The absence of a significant conduction band offset in the Si/SiGe material system means that the QW 66 is primarily defined by the n-type (e.g., phosphorous) δ-doping spike 60. (In contrast, the $Si_{0.6}Ge_{0.4}$ layer 18, 20 is used to help define the quantum well 26 on the p-side of the n-channel TFET 10, but this is enabled by the relatively large valence band offset in the Si/SiGe material system).

However, n-type δ-doping with phosphorous (P) is more problematic than p-type δ-doping with boron. Unlike boron (B), which is an interstitial diffuser, phosphorous (P) is generally a vacancy mediated diffuser. As a result, the presence of Ge-containing layers enhances phosphorous outdiffusion. Therefore, in the p-channel TFET 50 a thin undoped Si layer 58 (which in the illustrative embodiment has a thickness of about 1 nm) is interposed between the delta doping 60 and the channel 56 in order to separate the P δ-doping spike 60 and the SiGe channel 56.

Figure 14:
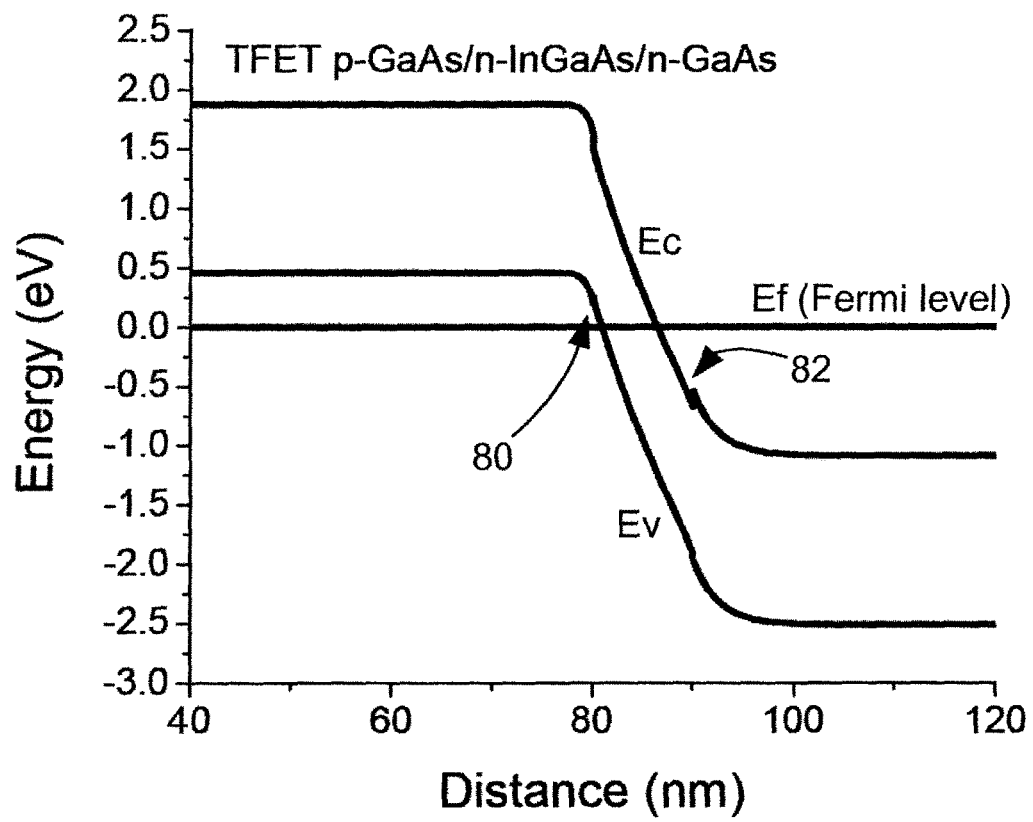
FIGS. 14 and 15 diagrammatically illustrate two n-channel TFET devices in the indium-gallium-arsenide III-V system.

With reference to FIG. 14, an illustrative example of an n-channel TFET in the indium-gallium-arsenide III-V system is shown by way of illustrative band diagrams. FIG. 14 shows a p-GaAs/n-$In_{0.2}Ga_{0.8}$As/n-GaAs TFET structure in which the channel is n-type $In_{0.2}Ga_{0.8}$As. The valence band discontinuity ΔEv between the p-GaAs and the n-$In_{0.2}Ga_{0.8}$As forms a valence band quantum well (QW) 80, while the conduction band discontinuity ΔEc between the n-$In_{0.2}Ga_{0.8}$As and the n-GaAs forms a conduction band QW 82. This design could be augmented by placing some InAs, or In-rich InGaAs at the source (e.g., at approximately 75 nm using the abscissa scale of FIG. 14) to create the reservoir of carriers analogous to the QW 26 in the n-channel Si/SiGe TFET (cf. FIG. 3).

Figure 15:
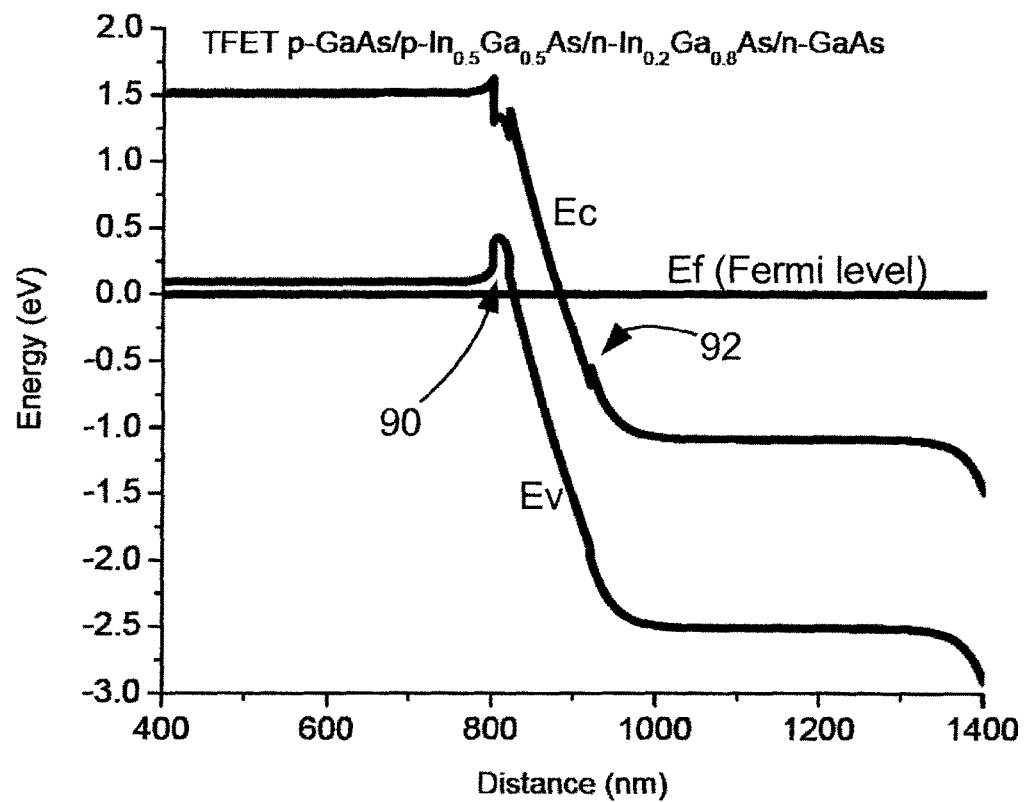

With reference to FIG. 15, an illustrative example of such an augmented design is shown. Here, a thin 50% In-containing layer is added, so as to form a p-GaAs/p-$In_{0.5}Ga_{0.5}$As/n-$In_{0.2}Ga_{0.8}$As/n-GaAs structure in which the channel is again n-type $In_{0.2}Ga_{0.8}$As. Here, however, a relatively larger (as compared with the example of FIG. 14) valence band QW 90 is formed by the p-$In_{0.5}Ga_{0.5}$As layer, while the conduction band discontinuity ΔEc between the n-$In_{0.2}Ga_{0.8}$As and the n-GaAs again forms a conduction band QW 92. This design is more closely analogous (as compared with FIG. 14) to the QW 26 in the n-channel Si/SiGe TFET (cf. FIG. 3).

The preferred embodiments have been described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method for fabricating a tunneling field-effect transistor (TFET), the method comprising:
    growing a silicon-germanium TFET layer structure by LT-MBE at a growth temperature at or below 500° C.; and
    processing the silicon-germanium TFET layer structure to form a TFET device.

2. The method as set forth in claim 1, wherein the growing is at a growth temperature at or below 400° C.

3. The method as set forth in claim 1, wherein the method further comprises:
    annealing the silicon-germanium TFET layer structure at a temperature of at least 600° C.;
    wherein the processing to form a TFET device is performed before or after the annealing.

4. The method as set forth in claim 3, wherein the annealing is at a temperature of at least 800° C.

5. A method for fabricating a tunneling field-effect transistor (TFET), the method comprising:
    epitaxially growing a silicon-germanium TFET layer structure wherein the silicon-germanium TFET layer structure includes a degenerately doped layer grown at a temperature of 400° C. or lower and a channel layer of silicon or silicon-germanium spaced apart from the degenerately doped layer by a tunneling spacer layer of silicon or silicon-germanium; and
    processing the silicon-germanium TFET layer structure to form a TFET device.

6. The method as set forth in claim 5, wherein the degenerately doped layer is grown at a temperature of about 320° C.

7. The method as set forth in claim 5, wherein the method, further comprises:
    annealing the silicon-germanium TFET layer structure at a temperature of at least 600° C.;
    wherein the processing to form a TFET device is performed before or after the annealing.

8. The method as set forth in claim 7, wherein the annealing is at a temperature of at least 800° C.

9. The method of claim 5 wherein the epitaxial growing comprises epitaxially growing the silicon-germanium TFET layer structure by low-temperature molecular beam epitaxy (LT-MBE) or chemical vapor deposition (CVD) epitaxy.

10. The method of claim 1 wherein the silicon-germanium TFET layer structure includes a degenerately doped layer and a channel layer of silicon or silicon-germanium spaced apart by a tunneling spacer layer of silicon or silicon-germanium.

11. A method for fabricating a tunneling field-effect transistor (TFET), the method comprising:
- epitaxially growing a silicon-germanium TFET layer structure by low-temperature molecular beam epitaxy (LT-MBE) wherein the silicon-germanium TFET layer structure includes a degenerately doped layer and a channel layer of silicon or silicon-germanium spaced apart from the degenerately doped layer by a tunneling spacer layer of silicon or silicon-germanium;
- processing the silicon-germanium TFET layer structure to form a TFET device; and
- annealing the silicon-germanium TFET layer structure at a temperature of at least 600° C.;
- wherein the processing to form a TFET device is performed before or after the annealing.

12. The method of claim 11 wherein the degenerately doped layer is grown at a temperature of 400° C. or lower.

* * * * *